(12) United States Patent
Montanini et al.

(10) Patent No.: US 9,000,564 B2
(45) Date of Patent: Apr. 7, 2015

(54) PRECISION POLYSILICON RESISTORS

(71) Applicants: STMicroelectronics, Inc., Coppell, TX (US); International Business Machines Corporation, Armonk, NY (US); GlobalFoundries Inc., Grand Cayman (KY); Samsung Electronics Co., Ltd., Gyeonggi-Do (KR)

(72) Inventors: Pietro Montanini, Albany, NY (US); Gerald Leake, Jr., Wallkill, NY (US); Brett H. Engel, Ridgefield, CT (US); Roderick Mason Miller, Mechanicville, NY (US); Ju Youn Kim, Seoul (KR)

(73) Assignees: STMicroelectronics, Inc., Coppell, TX (US); International Business Machines Corporation, Armonk, NY (US); GlobalFoundries, Inc., Grand Cayman (KY); Samsung Electronics Co., Ltd., Gyeonggi-do (KR)

( * ) Notice: Subject to any disclaimer, the term of this patent is extended or adjusted under 35 U.S.C. 154(b) by 5 days.

(21) Appl. No.: 13/725,837

(22) Filed: Dec. 21, 2012

(65) Prior Publication Data

US 2014/0175609 A1    Jun. 26, 2014

(51) Int. Cl.
| | |
|---|---|
| H01L 29/00 | (2006.01) |
| H01L 49/02 | (2006.01) |
| H01L 27/06 | (2006.01) |
| H01L 27/08 | (2006.01) |

(52) U.S. Cl.
CPC .......... H01L 28/20 (2013.01); H01L 27/0629 (2013.01); H01L 27/0802 (2013.01)

(58) Field of Classification Search
CPC ..... H01L 28/20; H01L 23/5228; H01L 28/40; H01L 28/24; H01L 27/0629
USPC ........... 257/538, 379, 380, E21.004, E27.016
See application file for complete search history.

(56) References Cited

U.S. PATENT DOCUMENTS

| 7,994,576 B2 * | 8/2011 | Tseng et al. | 257/350 |
|---|---|---|---|
| 8,680,618 B2 * | 3/2014 | Eshun | 257/350 |
| 2013/0105912 A1 * | 5/2013 | Hsu et al. | 257/379 |

* cited by examiner

Primary Examiner — Andy Huynh
(74) Attorney, Agent, or Firm — Seed IP Law Group PLLC

(57) ABSTRACT

Use of a replacement metal gate (RMG) process provides an opportunity to create precision polysilicon resistors alongside metal gate transistors. During formation of a sacrificial polysilicon gate, the precision polysilicon resistor can also be formed from the same polysilicon film. The polysilicon resistor can be slightly recessed so that a protective insulating layer can cover the resistor during subsequent replacement of the sacrificial gate with a metal gate. The final structure of the precision polysilicon resistor fabricated using such a process is more compact and less complex than existing structures that provide metal resistors for integrated circuits having metal gate transistors. Furthermore, the precision polysilicon resistor can be freely tuned to have a desired sheet resistance by either implanting the polysilicon film with dopants, adjusting the polysilicon film thickness, or both.

20 Claims, 7 Drawing Sheets

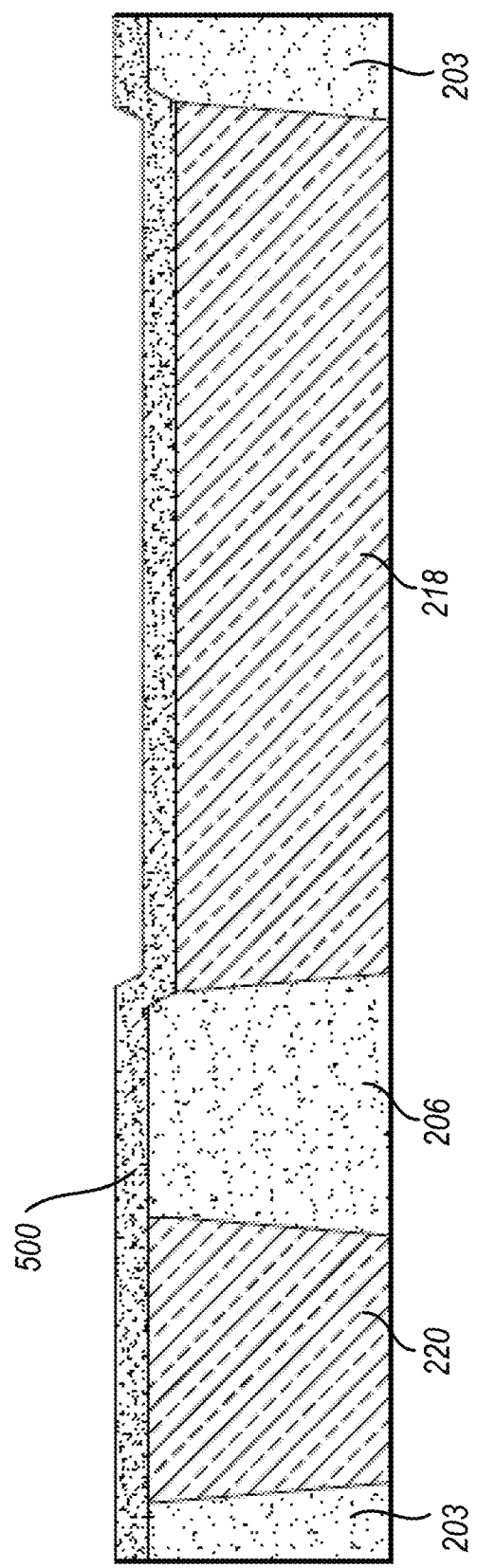

PRECISION POLYSILICON RESISTORS

BACKGROUND

1. Technical Field

The present disclosure relates to the fabrication of integrated circuit transistors, and in particular, devices that are fabricated using a replacement metal gate process.

2. Description of the Related Art

An integrated circuit chip typically includes precision resistors that can be accessed by circuit designers for use by various devices on board the chip. For example, resistors may be needed to regulate power supplied on board the chip, or to fulfill impedance matching requirements for communications functions that may need certain input or output resistances. In the past, when transistor gates were made of polysilicon, it was straightforward to pattern precision resistors as part of the polysilicon mask layer, thus integrating the fabrication of the resistors with that of the active devices.

With the development of metal gate transistors, there has arisen an incompatibility between metals that are suitable for use as transistor gates and metals that are suitable for use as precision metal resistors. For example, aluminum, often used for metal gates, lacks the resistivity needed for precision metal resistors. Materials such as tantalum nitride (TaN), tungsten (W), titanium nitride (TiN), titanium aluminum (TiAl) or other metals having a similar work function have been substituted to form the integrated resistors. When material properties are not interchangeable, however, it is generally not feasible to deposit and pattern precision resistors as part of the metal gate mask layer. A drawback to building resistors out of such metals is that the use of these additional materials necessitates extra equipment and process steps, and generally increases the complexity, and therefore the cost, of the semiconductor manufacturing process. Generally, it is desirable to fabricate precision resistors from a material that is already available in the existing process flow for metal gate transistors.

BRIEF SUMMARY

Use of a replacement metal gate (RMG) process provides an opportunity to create precision polysilicon resistors alongside metal gate transistors. This opportunity exists because, initially, a sacrificial polysilicon gate is formed, and then it is replaced with a metal gate. Therefore, during formation of the sacrificial polysilicon gate, a polysilicon resistor can also be formed from the same polysilicon film. Instead of depositing a flat blanket layer of polysilicon on a flat surface, the shallow trench isolation (STI) oxide below the desired location of the polysilicon resistor can be slightly recessed and the conformal polysilicon deposition follows the recessed contour of the STI oxide. This recess allows room for a protective insulating layer to cover the resistor during subsequent replacement of the sacrificial polysilicon gate with a metal gate. The final precision polysilicon resistor structure (FIG. 2) is more compact and less complex than existing structures that provide metal resistors for integrated circuits having metal gate transistors (FIG. 1).

A precision polysilicon resistor can be tuned to have a desired sheet resistance by either implanting the polysilicon film with dopants, adjusting the polysilicon film thickness, or both. Because the polysilicon gate is sacrificial, even if there could be a specific thickness requirement (for example, in case the polysilicon thickness constrains the RMG process), doping the gate can be arranged in order to match a specified sheet resistance. A precision polysilicon resistor structure adjacent to a metal gate transistor can include, in addition to the polysilicon resistor itself, an extended isolation field formed in the silicon substrate, the isolation field filled with an oxide that is recessed relative to the upper surface of the silicon substrate; an insulating material covering, and in contact with, the polysilicon resistor; an inter-layer dielectric; and one or more metal plugs that penetrate the inter-layer dielectric to make ohmic contact with the polysilicon resistor at a metal-polysilicon junction.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 5 is a side view showing a polysilicon film deposited conformally over both the isolation trench and the recessed isolation field as described herein.

DETAILED DESCRIPTION

Figure 1:
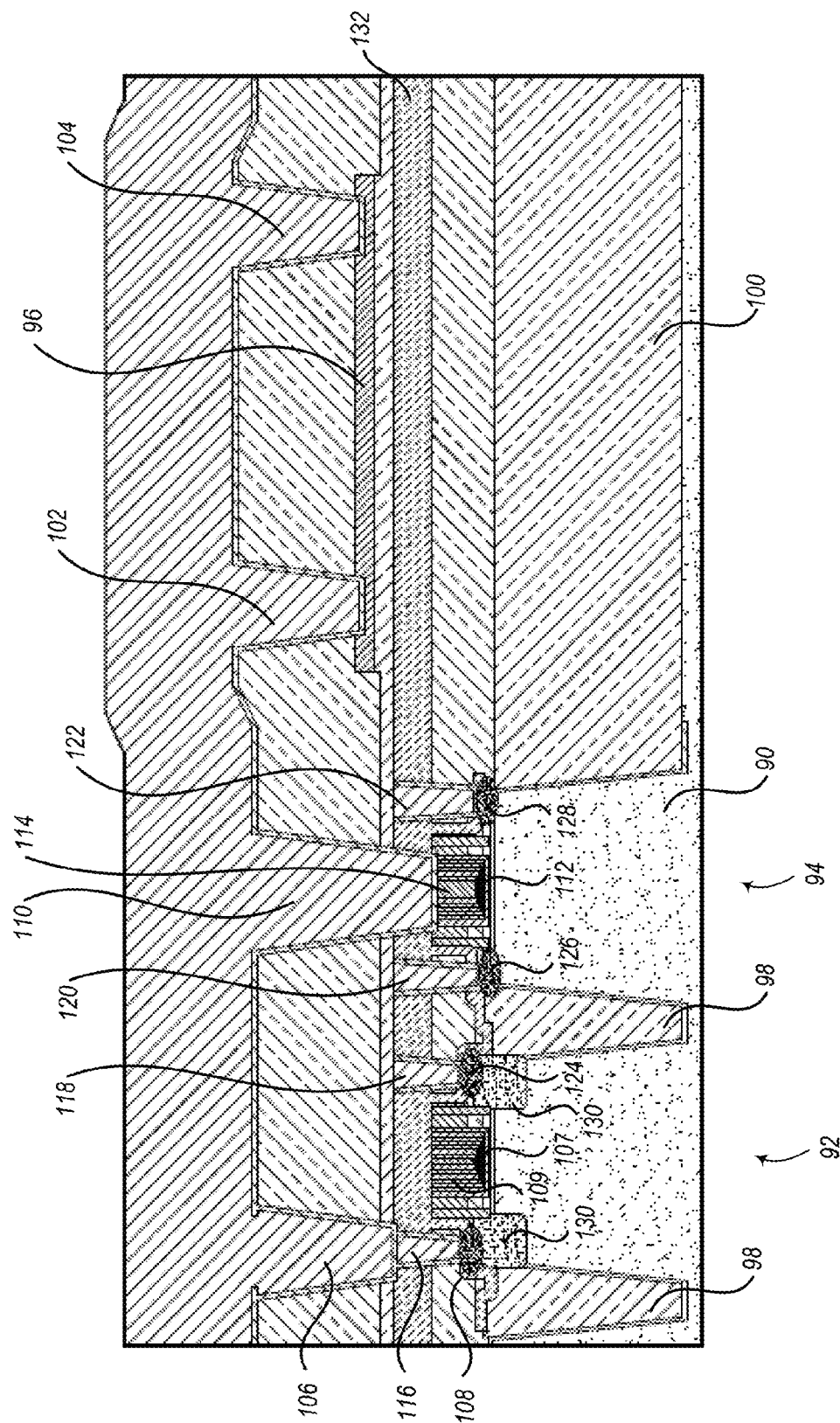
FIG. 1 is a side view of a pair of RMG transistors adjacent to a metal resistor that is formed in a different layer, vertically separated by an oxide barrier, from the RMG transistors, according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to insulating materials or semiconducting materials can include various materials other than those used to illustrate specific embodiments of the transistor devices presented. The term "epitaxial silicon compounds" should not be construed narrowly to limit an epitaxially grown structure to Si or SiGe, for example, but rather, the term "epitaxial silicon compounds" is broadly construed to cover any compounds that can be grown epitaxially from a crystalline silicon surface.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, include a spin-expose-develop process sequence involving a photoresist. Such a photolithography sequence entails spinning on the photoresist, exposing areas of the photoresist to ultraviolet light through a patterned mask, and developing away exposed (or alternatively, unexposed) areas of the photoresist, thereby transferring a positive or negative mask pattern to the photoresist. The photoresist mask can then be used to etch the mask pattern into one or more underlying films. Typically, a photoresist mask is effective if the subsequent etch is relatively shallow, because photoresist is likely to be consumed during the etch process. Otherwise, the photoresist can be used to pattern a hard mask, which in turn, can be used to pattern a thicker underlying film.

Reference throughout the specification to conventional etching techniques known in the art of semiconductor fabrication for selective removal of polysilicon, silicon nitride, silicon dioxide, metals, photoresist, polyimide, or similar materials include such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Use of the term "adjacent to" in the specification is meant to describe a side-by-side configuration as opposed to a configuration in which integrated circuit components are separated from one another in separate layers.

Use of the terms "gate" or "gate structure" throughout the specification may refer collectively to a gate and its associated structural parts, including a gate dielectric, sidewall spacers, and, in some cases, a gate contact.

Specific embodiments are described herein with reference to examples of RMG structures that have been produced. The terms "replacement metal gate" (RMG) and "sacrificial gate" as used herein include all structures of this type and are meant in the broad sense. The present disclosure and the reference to certain materials, dimensions, and the details and ordering of processing steps are exemplary and should not be limited to those shown, unless specifically noted.

In the figures, identical reference numbers identify similar features or elements. The sizes and relative positions of the features in the figures are not necessarily drawn to scale.

FIG. 1 shows a silicon substrate 90 in which a pair of metal gate transistors 92 and 94, respectively, are built near a metal resistor 96, in accordance with conventional structures and methods. Isolation trenches 98 filled with an insulating material such as silicon dioxide serve to isolate the active devices, while an extended isolation field 100, also filled with silicon dioxide, lies underneath the metal resistor 96. The cross-section cut as shown intercepts contacts 102 and 104 to the metal resistor 96. The metal resistor 96 can be made of a metal such as TiN, TiAl, TaN, or WSi. The metal gate transistor 92 is shown as a PFET (positive field effect transistor) in which the cross-section cut intercepts an exemplary contact 106 to a positive source 108. The metal gate transistor 92 has a metal gate 107 that includes an aluminum core 109. The metal gate transistor 94 is shown as an NFET (negative field effect transistor) in which the cross-section cut intercepts an exemplary contact 110 to a metal gate 112. The metal gate 112 includes an aluminum core 114.

The exemplary contacts 106 and 110 can be made of, for example, tungsten. The exemplary contact 106 is shown coupled to a tungsten plug 116. Three other tungsten plugs are shown, 118, 120, and 122, coupled to a p-doped drain 124 of the PFET metal gate transistor 92, and to an n-doped source 126, and an n-doped drain 128 of the NFET metal gate transistor 94, respectively. An inter-layer dielectric 129 generally fills the space between contacts (both for the metal gate transistors 92 and 94 and the metal resistor 96) to provide insulation.

Junctions at the bottom of each tungsten plug may be epitaxial junctions. Contacts to the junctions may be ohmic contacts, achieved by depositing, for example, nickel below the tungsten plugs 116, 118, 120, and 122, and allowing the nickel to react with underlying silicon to form a nickel silicide. The source and drain regions of the PFET transistor 92 are shown within wells 130 that can consist of an epitaxially grown silicon compound such as, for example, silicon, silicon germanium, or silicon carbide.

A layer of insulating material 132 (e.g., a nitride or oxide layer) vertically separates the metal gate transistors 92 and 94 from the metal resistor 96 so that the metal resistor 96 lies in a different layer than the metal gate transistors 92 and 94. Thus, the metal resistor 96 is not adjacent to or alongside the metal gate transistors 92 and 94, but instead is vertically separated from these devices (e.g., located in a different layer, above the metal gate transistors). It is clear from FIG. 1 that depositing and patterning extra layers in order to form the metal resistor 96 from different materials than those which are used to build the metal gates 107 and 112 introduces complexity and cost into the fabrication process.

Figure 2:
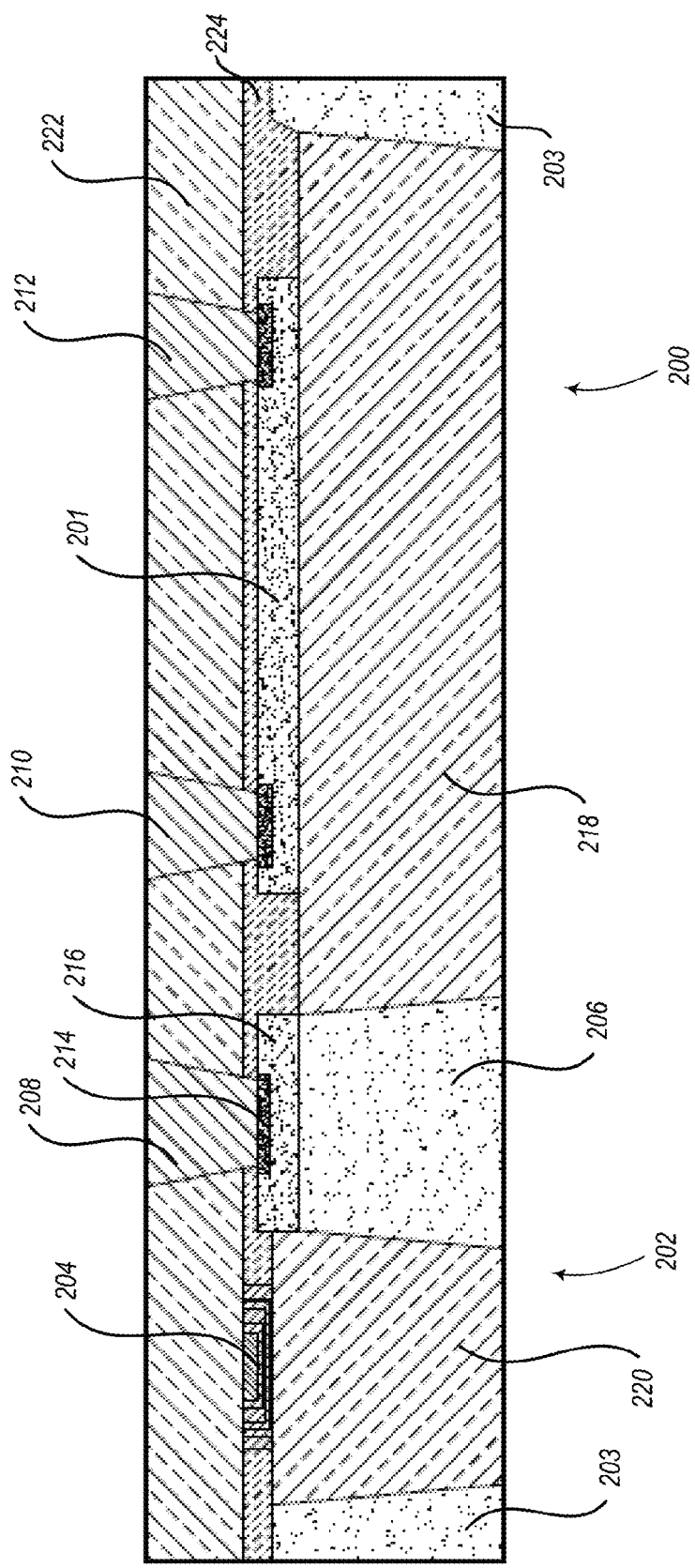
FIG. 2 is a side view of a completed RMG device adjacent to a precision polysilicon resistor as described herein.

FIG. 2 shows one embodiment of a finished precision polysilicon resistor structure 200 built adjacent to, and in coordination with, an RMG transistor 202 on a silicon substrate 203, according to a method described herein. The RMG transistor 202 includes a replacement metal gate 204, shown in FIG. 2 as a multi-layer metal transistor gate. Such a multi-layer metal transistor gate can have at its core, a material such as, for example, aluminum. The precision polysilicon resistor structure 200 includes a precision polysilicon resistor 201 and neighboring materials such as electrical contacts, insulators, and the like. Unlike the metal resistor 96 shown in FIG. 1, the precision polysilicon resistor 201 is adjacent to the RMG transistor 202 in the same layer as the replacement metal gate 204, as opposed to being located fully or substantially above or below the transistor, in a different layer from the replacement metal gate 204. It is clear from FIG. 2 that the precision polysilicon resistor 201 is formed in parallel with formation of the RMG transistor 202, as opposed to being formed sequentially, following completion of the RMG transistor 202, as is evident in the conventional integrated structure shown in FIG. 1. Thus, dedicated layers in the process and associated dedicated processing equipment is not needed to provide the precision polysilicon resistor 201.

The RMG transistor 202 further includes source and drain regions such as, for example, active area 206, which, in some embodiments, can be at least partially made of epitaxial silicon or an epitaxial silicon compound. The cross-section cut as shown in FIG. 2 intercepts a contact 208 to the active area 206 and two contacts, 210 and 212, to the precision polysilicon resistor 201. At the bottom of the contact 208 there may be a region of metal silicide 214 (e.g., NiSi) to facilitate establishing an ohmic contact with a top portion of the active area 206, in which may be formed an epitaxial junction 216.

The precision polysilicon resistor 201 is formed on an extended isolation field 218 (oxide) similar to the isolation trench 220 that is used to electrically isolate neighboring transistors. However, the isolation field 218 can have dimensions within the range of about 0.5 µm×0.5 µm to 15 µm×50 µm. An inter-layer dielectric 222 fills the space around the contacts 208, 210, and 212 to provide insulation therebetween. An insulating layer 224 (e.g., oxide or nitride) may be conformally deposited and planarized to provide protection for underlying structures during the replacement metal gate process.

Figure 3:
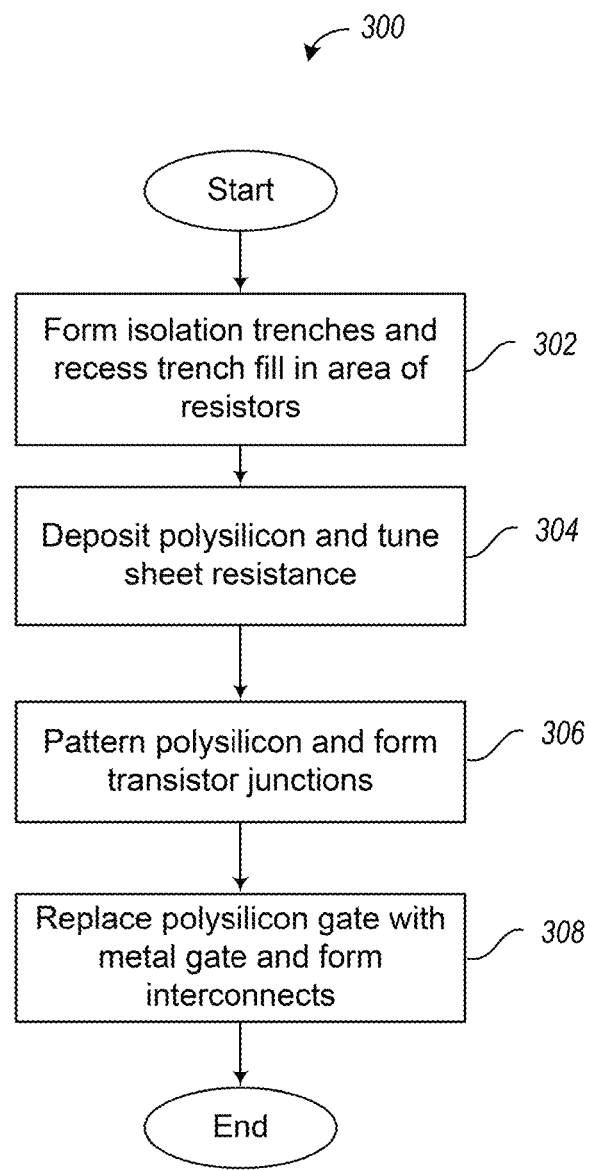
FIG. 3 is a high-level process flow diagram showing basic steps in forming the RMG transistor adjacent to the precision polysilicon resistor shown in FIG. 2.

FIG. 3 is a high-level flow diagram describing a fabrication process 300 for the exemplary RMG transistor and polysilicon resistor embodiment shown in FIG. 2.

At 302, the isolation trench 220 and the isolation field 218 are formed, for example, using a conventional shallow trench isolation (STI) process sequence. Then the fill oxide within the isolation field 218 is recessed in the area of the precision polysilicon resistor 201.

At 304, polysilicon is deposited as material for both a sacrificial transistor gate and a polysilicon resistor 201.

At 306, the polysilicon is patterned and transistor junctions are formed.

At 308, the polysilicon gate can be replaced with a metal gate, and the contacts 208, 210, and 212 can be coupled to the metal gate and the precision polysilicon resistor 201, respectively.

With reference to FIGS. 4A-7B below, each set of figures shows one of the steps in FIG. 3 in more detail by presenting a more comprehensive sequence of process steps and a corresponding side view that results upon completion of that sequence of steps.

Figures 4A, 4B:
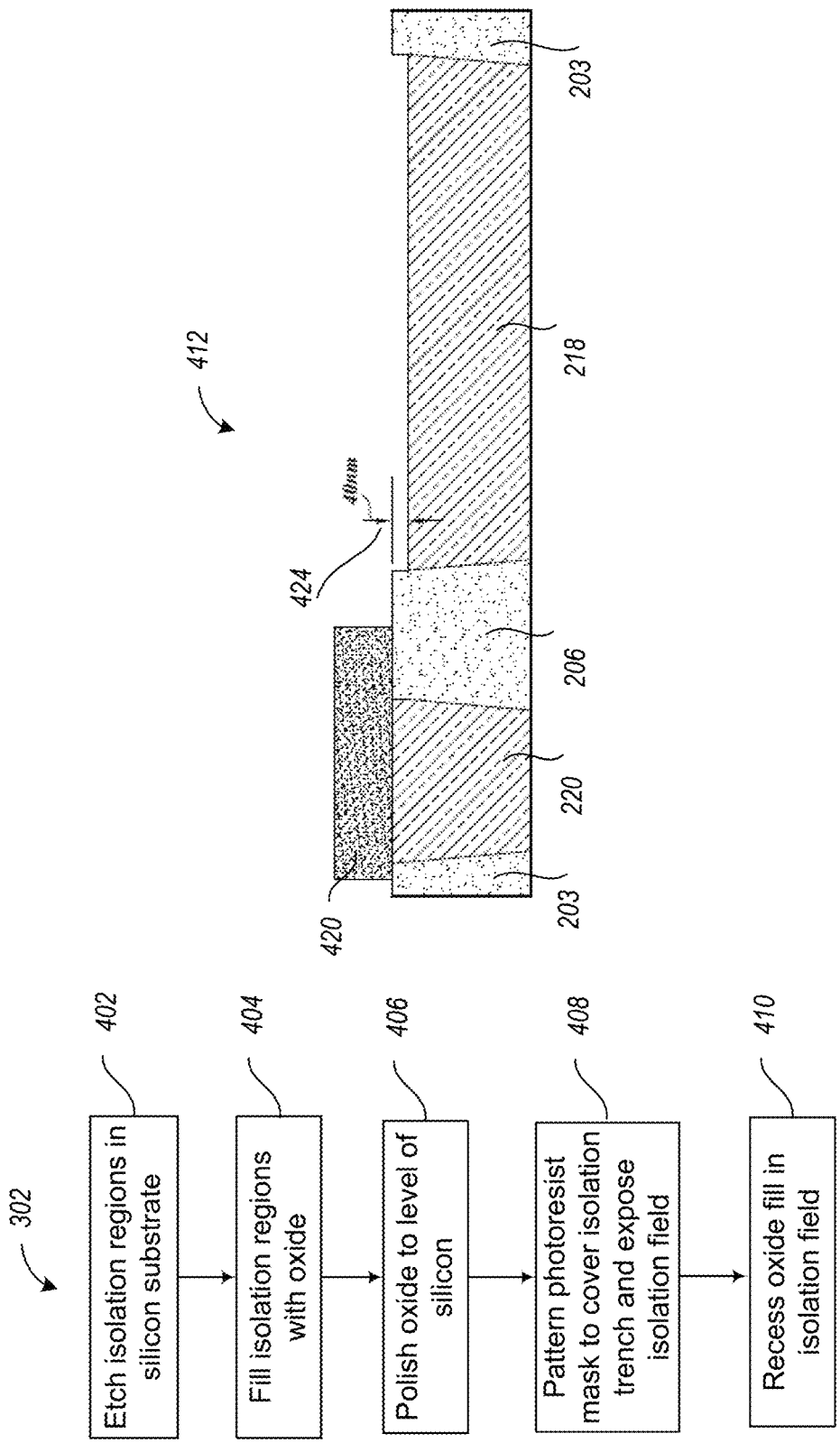
FIG. 4A is a process flow diagram showing a sequence of process steps that can be used to form a recessed isolation field.
FIG. 4B is a side view showing the isolation regions formed by the steps described in FIG. 4A.

FIGS. 4A and 4B illustrate the step 302 in greater detail, in which different isolation regions 412 are established and the isolation oxide is recessed in the area of the precision polysilicon resistor 201. FIG. 4A shows a sequence of process steps, including the steps 402, 404, 406, and 408, and 410 that can be carried out to form isolation regions 412.

At 402, the isolation regions 412 can be formed in the silicon substrate 203 using a photoresist mask and etching the silicon substrate using a plasma etch.

At 404, the isolation regions 412 can be filled with an insulating material such as silicon dioxide using, for example, a conventional high-density plasma (HDP) oxide deposition process.

At 406, the silicon dioxide filling the isolation field 218 and the isolation trench 220 can be polished using the silicon substrate 203 as a polish stop layer in a conventional planarization (CMP) process.

At 408, a photoresist mask 420 can be patterned to cover the filled isolation trench 220 and to expose the filled isolation field 218.

At 410, the oxide fill within the isolation field 218 can be recessed by a prescribed recess depth 424, e.g., 40 nm as shown, using a standard oxide removal process that is selective to silicon and photoresist, such as a hydrofluoric acid (HF) dip, or a buffered oxide etch (BOE) that is compatible with the photoresist mask 420. The recess depth 424 can be adjusted so as to slightly lower the polysilicon resistor 201 relative to the height of the sacrificial polysilicon gate, while maintaining both the resistor and the sacrificial polysilicon gate adjacent to one another within the same process layer. The recess depth 424 can clearly be seen in FIG. 4B, relative to the height of the oxide fill within the isolation trench 220.

FIG. 5 illustrates the step 304 in greater detail, in which a conformal polysilicon film 500 is deposited to be used as both a sacrificial gate material and also a resistor material. FIG. 5 shows the silicon substrate 203, the filled isolation field 218, and the filled isolation trench 220, along with the common polysilicon film 500 conformally deposited on the surface, so that the layer of polysilicon is also recessed over the recessed isolation field. During deposition of the polysilicon, the sheet resistance of the material in units of Ohms per square (Ω/☐) can be tuned to a desired value by either implant-doping the material in situ or by adjusting the deposition time to vary the thickness of the polysilicon film. Dopants used to tune the sheet resistance can include typical junction dopants such as boron, phosphorous, and arsenic. The addition of such dopants tends to change the resistivity of the polysilicon film, typically causing the sheet resistance to decrease to a lower value.

Figures 6A, 6B:
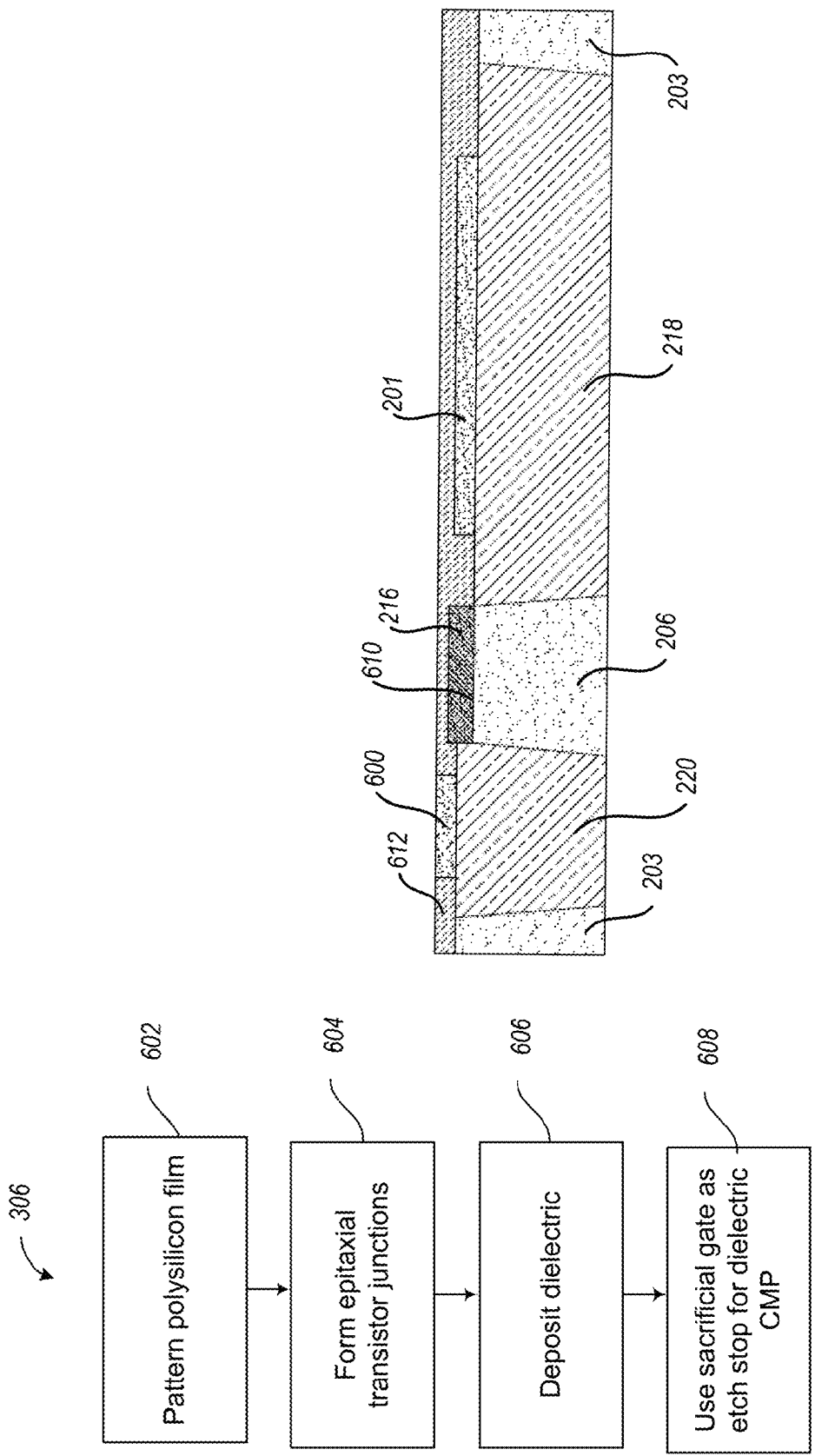
FIG. 6A is a process flow diagram showing a sequence of process steps that can be used to pattern the polysilicon film and form epitaxial junctions as shown in FIG. 6B.
FIG. 6B is a side view of a device profile formed by the process flow shown in FIG. 6A, in which the sacrificial polysilicon gate, the precision polysilicon resistor, and the epitaxial junctions have been formed.

FIGS. 6A and 6B illustrate the step 306 in greater detail, in which a sequence of process steps, including the steps 602, 604, 606, and 608 can be carried out to pattern the polysilicon film 500 to form the precision polysilicon resistor 201 and a sacrificial polysilicon gate 600. Transistor source and drain junctions can then be formed using the sacrificial polysilicon gate 600 as a mask.

At 602 the polysilicon film can be patterned using conventional lithography and etching processes. As shown in FIG. 6B, a polysilicon shape can be formed over the isolation trench 220 as the sacrificial gate 600 for logic or memory arrays. Meanwhile, another large polysilicon shape can be formed over the isolation field 218 as the precision polysilicon resistor 201.

At 604 the sacrificial gate 600 can be used in place of a mask to position the source and drain junctions in a self-aligned fashion, without need for a separate mask layer. The epitaxial junction 216 can then be formed by epitaxial growth of silicon or a silicon compound from the exposed silicon substrate in the active area 206. Although the particular cross-section cut shown in FIG. 6B shows the isolation trench 220 directly underneath the sacrificial gate 600, in another cross-section cut, for example, behind or in front of the one shown, the silicon active area 206 extends underneath the sacrificial gate 600, so that a lateral boundary of the epitaxial junction 216 reaches the sides of the sacrificial gate 600, and possibly extends below the sacrificial gate. If necessary, a photoresist mask can be used to cover areas of the exposed silicon substrate 203 where epitaxial growth is not desired. The lower epitaxial growth boundary 610 is defined by the silicon etch. Thus, the epitaxial junction 216 may extend below the adjacent surface of the filled isolation trench 220. In the exemplary embodiment shown in FIG. 6B, the lower epitaxial growth boundary 610 is approximately even with the surface of the recessed isolation oxide fill underneath the polysilicon resistor 201.

At 606 a blanket layer of a protective insulating material 612 (e.g., an oxide or nitride) can be conformally deposited over the entire structure shown, as indicated in FIG. 6B, using a conventional deposition method.

At 608 the insulating material 612 can be planarized using a conventional CMP process in which the polysilicon gate 600 provides a stop layer which prevents the polisher from reaching either the epitaxial junction 216 or the recessed precision polysilicon resistor 201. In this way, the sacrificial polysilicon gate 600 can be used to preserve the film quality of the epitaxial junction 216 and to maintain the desired thickness of the precision polysilicon resistor 201 which, if it were altered, would change the component resistance.

For clarity, details of the polysilicon gate structure are omitted from FIG. 6B. Such structural details typically include a gate dielectric, residual gate hard mask, and sidewall spacers.

Figures 7A, 7B:
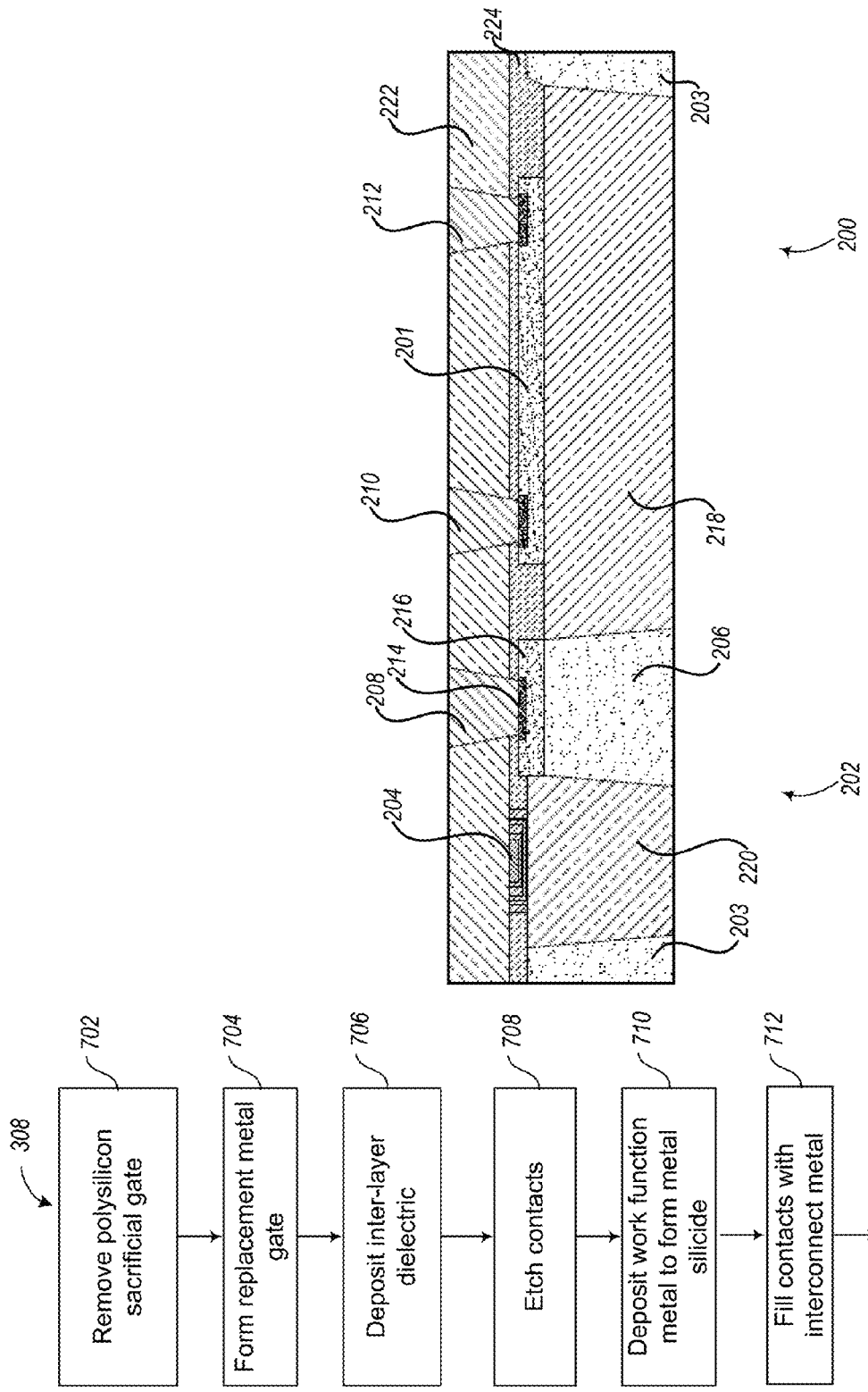
FIG. 7A is a process flow diagram showing a sequence of process steps that can be used to form a replacement metal gate and electrical contacts to access the RMG transistor and the precision polysilicon resistor.
FIG. 7B is a side view of a complete device profile formed by the process flow described herein.

FIGS. 7A and 7B illustrate the step 308 in greater detail, in which a sequence of process steps, including the steps 702, 704, 706, and 708, can be carried out to replace the sacrificial polysilicon gate 600 with the operable metal gate 204 of the RMG transistor 202, and to form the contacts 208, 210, and 212 to the precision polysilicon resistor 201 and the RMG transistor 202. FIG. 7B is a reproduction of FIG. 2, showing the finished precision polysilicon resistor adjacent to the RMG transistor 202. For clarity, details of the metal gate structure are omitted from FIG. 7B. Such details can include one or more of a gate dielectric, residual hard mask, and sidewall spacers.

At 702, the polysilicon sacrificial gate 600 can be removed using a wet chemical etchant that attacks silicon, selective to the insulating material 612. This step further illustrates the role of the recess depth 424, which allows the insulating material 612, in addition to protecting the precision polysilicon resistor 201 and the epitaxial junction 216 from damage during planarization of the insulating material 612 as described above, to also protect these structures during removal of the sacrificial gate 600.

At 704, the replacement metal gate 204 can be formed in place of the sacrificial gate 600. The material(s) used for the replacement metal gate 204 can be, for example, Ti, TiN, TiAl, TaN, $Al_2O_3$, Al, or alloys thereof, or any other suitable metal. The replacement metal gate 204 can include multiple metal layers as shown in FIG. 7B. Formation of the metal gate can use one or more conventional deposition or plating methods in accordance with the RMG material, in which the insulating material 612 can serve as an effective hard mask to protect underlying structures during the metal deposition process.

At 706, a thick layer of an insulating material can be deposited for use as the inter-layer dielectric 222. Typically, the inter-layer dielectric is an oxide or tetraethyl orthosilicate (TEOS) having a thickness in the range of about 50-150 nm.

At 708, contact holes can be etched through the inter-layer dielectric 222, and into the underlying precision polysilicon resistor 201 and the epitaxial junction 216.

At 710, a metal having a selected work function can be deposited at the bottom of each contact hole. The metal can then be allowed to react with the polysilicon resistor or the epitaxial silicon compound. Such a reaction produces a metal silicide that may facilitate formation of an ohmic contact at the metal-polysilicon or metal-silicon junction. The metal having a selected work function can be, for example, tungsten, nickel, platinum, titanium, cobalt, or alloys of such metals.

At 712, the contact holes can be filled with a metal plug such as tungsten (W) to form contacts 208, 210, and 212 to the epitaxial junction 216 and the precision polysilicon resistor 201, respectively. A contact can also be made to the metal gate 600, however, such a gate contact is not shown in the particular cross-section cut shown in FIG. 7B.

At 714, the contact metal can be planarized using the inter-layer dielectric 222 as a polish stop layer for a conventional metal planarization (CMP) step.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A precision polysilicon resistor structure comprising:
   a silicon substrate having an upper surface;
   an isolation field formed in the silicon substrate, the isolation field filled with an oxide in contact with, and adjacent to, a metal gate transistor, the oxide recessed relative to the upper surface of the silicon substrate;
   a precision polysilicon resistor overlying, and in contact with, the filled isolation field;
   conformal insulating layer overlying, covering, and in contact with, both a top surface and a side surface of the polysilicon resistor; and
   an inter-layer dielectric; and one or more metal plugs that extend into the inter-layer dielectric to make ohmic contact with the polysilicon resistor at a metal-polysilicon junction.

2. The resistor structure of claim 1, wherein the metal plug includes tungsten.

3. The resistor structure of claim 1, wherein at least a portion of an active area of silicon within the metal gate transistor is an epitaxially grown portion.

4. The resistor structure of claim 3, wherein the epitaxially grown portion is doped with one or more of germanium or carbon.

5. The resistor structure of claim 1, further comprising a metal silicide formed at the metal-polysilicon junction.

6. The resistor structure of claim 5, wherein the metal silicide includes one or more of tungsten, nickel, platinum, titanium, cobalt, or alloys thereof.

7. The resistor structure of claim 1, further comprising one or more dopants incorporated into the polysilicon resistor, the dopants causing a change in a sheet resistance of the polysilicon resistor.

8. The precision polysilicon resistor structure of claim 7 wherein the dopants are implanted into the polysilicon film.

9. The precision polysilicon resistor structure of claim 1 wherein the polysilicon resistor includes a polysilicon film having a film thickness that determines, at least in part, a resistance value of the polysilicon resistor.

10. The precision polysilicon resistor structure of claim 9 wherein the resistance value of the polysilicon film is determined partly by implant-doping, and partly by tuning the film thickness.

11. An integrated circuit comprising:
a silicon substrate;
a metal gate transistor formed in the silicon substrate, the transistor including:
one or more isolation trenches;
a source region;
a drain region; and
a replacement metal gate; and
a polysilicon resistor adjacent to the metal gate transistor, the polysilicon resistor formed over, and in contact with, a recessed isolation field, a conformal insulating layer overlying, covering, and in contact with both a top surface and a side surface of the polysilicon resistor.

12. The integrated circuit of claim 11, wherein the source and drain regions are formed using a sacrificial polysilicon gate as a mask.

13. The integrated circuit of claim 11, wherein the source and drain regions are epitaxially grown.

14. The integrated circuit of claim 11, further comprising electronic components, other than the metal gate transistor, that are selectively coupled to the polysilicon resistor.

15. The integrated circuit of claim 11, wherein the polysilicon resistor is tuned by implanting with dopants.

16. The integrated circuit of claim 11, wherein the polysilicon resistor includes a polysilicon film having a film thickness and the polysilicon resistor is tuned during fabrication by varying the polysilicon film thickness.

17. The integrated circuit of claim 11, further comprising tungsten interconnects in which ohmic contacts to the polysilicon resistor are formed by a metal silicide.

18. The integrated circuit of claim 11, further comprising additional polysilicon resistors adjacent to the metal gate transistor, wherein the polysilicon resistors have different polysilicon film thicknesses.

19. The integrated circuit of claim 11, further comprising one or more additional doped polysilicon resistors adjacent to the metal gate transistor, wherein the additional doped polysilicon resistors incorporate different dopant materials.

20. The integrated circuit of claim 19, wherein the additional doped polysilicon resistors have sheet resistance values that are less than a sheet resistance value of the un-doped polysilicon resistor.

* * * * *

UNITED STATES PATENT AND TRADEMARK OFFICE
CERTIFICATE OF CORRECTION

| | |
|---|---|
| PATENT NO. | : 9,000,564 B2 |
| APPLICATION NO. | : 13/725837 |
| DATED | : April 7, 2015 |
| INVENTOR(S) | : Pietro Montanini et al. |

It is certified that error appears in the above-identified patent and that said Letters Patent is hereby corrected as shown below:

In the Claims

Column 8, Line 64:
"conformal insulating layer overlying, covering, and in contact" should read as --a conformal insulating layer overlying, covering, and in contact--.

Signed and Sealed this
Third Day of November, 2015

Michelle K. Lee
*Director of the United States Patent and Trademark Office*